United States Patent [19]

Kitada et al.

[11] Patent Number: 4,783,711
[45] Date of Patent: Nov. 8, 1988

[54] MAGNETORESISTIVE SENSOR HAVING MAGNETIC SHIELDS OF FERRITE

[75] Inventors: Masahiro Kitada, Tokyo; Hideo Tanabe, Higashimurayama; Noboru Shimizu, Tokorozawa; Hitoshi Nakamura, Hachiouji; Kazuhiro Momata, Chigasaki; Shigeyoshi Kato, Hatno; Tooru Takeura, Odawara; Tetsuo Kobayashi, Kanagawa, all of Japan

[73] Assignee: Hitachi, Ltd., Tokyo, Japan

[21] Appl. No.: 879,567

[22] Filed: Jun. 27, 1986

[30] Foreign Application Priority Data

Jul. 12, 1985 [JP] Japan .................. 60-152213
Nov. 6, 1985 [JP] Japan .................. 60-247020

[51] Int. Cl.4 .................... G11B 5/00; G11B 5/33; G11B 5/39
[52] U.S. Cl. .................... 360/113; 360/128
[58] Field of Search .............. 360/113, 128, 115, 120, 360/127

[56] References Cited

U.S. PATENT DOCUMENTS

| 4,103,315 | 7/1978 | Hempstead et al. ........... 360/113 X |
| 4,280,158 | 7/1981 | deNiet .................. 360/113 |
| 4,321,640 | 3/1982 | Van Gestel .............. 360/113 |
| 4,394,699 | 7/1983 | Kaminaka et al. ......... 360/113 |
| 4,425,593 | 1/1984 | Postma .................. 360/113 |
| 4,476,454 | 10/1984 | Aboat et al. ........... 300/113 X |
| 4,489,357 | 12/1984 | Van Ooijen et al. ...... 360/113 |

Primary Examiner—Stuart N. Hecker
Assistant Examiner—Alyssa H. Bowler
Attorney, Agent, or Firm—Antonelli, Terry & Wands

[57] ABSTRACT

In a magnetoresistive sensor having a magnetoresistive effect element which is held between two sheets of high permeability magnetic ferrite with insulating layers interposed between them, a ferromagnetic metal film is provided adherently to the high permeability magnetic ferrite between the ferrite and the insulating layer, a rise in temperature of the magnetoresistive effect element thereby being held down and a reproduced waveform being made sharp, and thus the characteristics of the element being improved with the life thereof prolonged.

14 Claims, 2 Drawing Sheets

THICKNESS OF FERROMAGNETIC METAL FILM (μm)

MAGNETORESISTIVE SENSOR HAVING MAGNETIC SHIELDS OF FERRITE

BACKGROUND OF THE INVENTION

The present invention relates to a magnetic sensor, and particularly it relates to a magnetoresistive sensor such as a reproducing magnetic head which uses a magnetoresistive element suited for a magnetic recording system such as a magnetic disk system or a magnetic tape system.

In a conventional magnetoresistive sensor, as disclosed in the Specification of the U.S. Pat. No. 3,940,797, a magnetoresistive film is formed on high permeability magnetic ferrite (Ni-Zn or Mn-Zn ferrite) with an insulating film of $SiO_2$, $Al_2O_3$ or the like interposed between them. The magnetoresistive film generates a very large quantity of heat, since high current of $10^5$ to $10^6$ $A/cm^2$ or above is applied thereon. The high permeability magnetic ferrite has a very low heat conductivity. Therefore the temperature of the element is increased by the heat and this causes the deterioration of characteristics. However, no consideration has been given heretofore to rapidly releasing a high heat caused thereby and keeping the element at low temperature.

Moreover, the aforesaid ferrite, which is used as a magnetic shield, is bulky ferrite which has a saturation flux density of 0.5 T at the highest and a permeability of about 200 to 300 at the most at 10 MHz, and thus flux from a magnetic recording medium scatters into the whole ferrite at low density. Therefore, the flux density in the vicinity of a magnetic gap is low. In this connection, no consideration has been given to making a reproduced waveform from the magnetoresistive film sharp, though the waveform therefrom is broad.

SUMMARY OF THE INVENTION

An object of the present invention is to furnish a magnetic sensor such as a magnetoresistive effect type reproducing head which enables the reduction in temperature rise in a magnetoresistive effect element unit and has a high output and a long life. Another object of the present invention is to furnish a magnetic sensor such as a ferrite shield type magnetoresistive effect head which reproduces a sharp waveform.

In order to attain the above-stated objects, the magnetoresistive sensor of the present invention is constructed in such a manner that a magnetoresistive effect element having a magnetoresistive film is held between two magnetic shields formed of high permeability magnetic ferrite, with an insulating layer interposed between the element and the shield, and a ferromagnetic metal film is formed adherently to said ferrite between at least one of the magnetic shields formed of the ferrite and said insulating layer.

By forming on the high permeability magnetic ferrite said ferromagnetic metal film having a permeability and a saturation flux density at least similar to those of said ferrite, the above-stated magnetoresistive sensor of the present invention enables the rapid dissipation of a heat generated from the magnetoresistive film without the deterioration of the characteristics of the magnetic shields, thus preventing decrease of the output and reduction of the life of the element which would otherwise be caused by a rise in temperature of the magnetoresistive film. This is enabled because the ferromagnetic metal film has generally a remarkably higher thermal conductivity than that of the high permeability magnetic ferrite. In this case an especially excellent action of heat dissipation can be attained with little deterioration due to wear and exfoliation, by making said film 0.1 to 3 μm thick. Moreover, when the permeability and/or the saturation flux density of this ferromagnetic metal film are higher than those of the aforesaid ferrite, the flux density of the shield side becomes high when the flux permeates into the film, and thereby an output waveform can be made so sharp that an output can be improved. In the case when this effect is to be utilized, it is preferable to make the ferromagnetic metal film 0.2 to 3 μm thick, and a more excellent result can be obtained especially when the thickness is made to be 0.8 to 3 μm.

The aforesaid ferromagnetic metal film may be formed of any metal material, including, for instance, an Ni-Fe alloy such as Ni-19 wt% Fe alloy (so-called permalloy), Fe-Si alloy, Co-Ni alloy, Fe-Si-Al alloy (so-called sendust) or a high permeability amorphous alloy such as Co-Mo-Zr amorphous alloy, for instance, which is formed by adding flass former element(s) such as Si, Ge, B, Ti, Zr, Mo, Nb, W and Ta to Co, Fe and/or Ni, the main components, on condition that the material has a permeability and/or a saturation flux density higher than or approximately equal to those of the high permeability magnetic ferrite.

DESCRIPTION OF THE PREFERRED EMBODIMENTS

Figure 1:
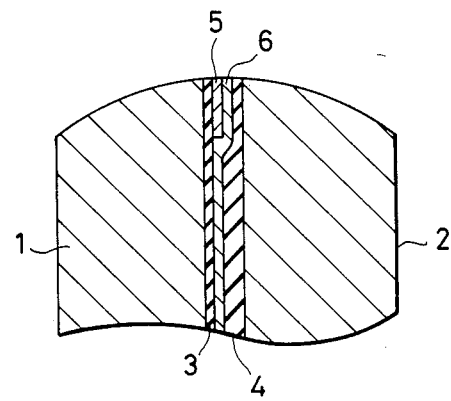
FIG. 1 is a sectional view showing a conventional magnetoresistive sensor.

First, the sectional structure of a conventional ferrite shield type magnetoresistive effect head is shown in FIG. 1. In this figure, numerals 1 and 2 denote high permeability magnetic ferrite such as nickel-zinc (Ni-Zn) ferrite, 3 an insulating layer of $Al_2O_3$, $SiO_2$ or the like, 4 an insulating layer of glass or an organic substance, 5 a magnetoresistive film, and 6 a conductive film for magnetic bias which acts also as a conductive film for a current terminal.

The magnetoresistive sensor of the present invention is constructed, for instance, by forming a ferromagnetic metal film between the ferrite 1 and the insulating layer 3 and/or between the ferrite 2 and the insulating layer 4 in the magnetoresistive effect head of FIG. 1 in such a manner that it is adherent to each ferrite.

Embodiment 1

Figure 2:
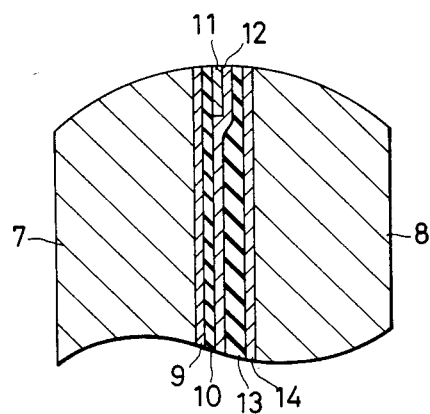
FIG. 2 is a sectional view showing a magnetoresistive sensor in one embodiment of the present invention.

FIG. 2 is a sectional view of a magnetoresistive sensor in the present embodiment, showing a ferrite/metal composite shield type magnetoresistive effect head. In FIG. 2, numerals 7 and 8 denote high permeability magnetic ferrite such as Ni-Zn ferrite, 9 a ferromagnetic crystalline or amorphous metal film, 10 an insulating layer of $Al_2O_3$ or the like, 11 a magnetoresistive film, 12 a magnetic biasing conductive film which is formed of a conductor of Mo, Ti, Au or the like and acts also as a current terminal, 13 an insulating film formed of a glass or an organic substance, and 14 the same ferromagnetic metal film as the above 9. The aforesaid high permeability magnetic ferrite 7 and 8 have a shield effect, and Ni-Zn ferrite 2 mm thick is used therefor in the present embodiment. For the ferromagnetic metal films 9 and 14, a Ni-19 wt% Fe alloy (permalloy) of thickness 0.1 to 3 μm is used. For the magnetoresistive film 11, a Ni-19 wt% Fe alloy is used. The above-stated magnetoresistive effect head in the present embodiment is manufactured in such a way that the aforesaid layers and films are formed on the high permeability magnetic ferrite 7 by such a well-known thin film forming technique as sputtering or vacuum evaporation and further the high permeability magnetic ferrite 8 is connected on the layered structure by using an adhesive.

On a magnetoresistive effect element, generally, current of $5 \times 10^5$ to $5 \times 10^6$ A/cm² is applied, and most of the heat generated thereby is dissipated by the heat conduction to the surrounding solid parts. If the magnetic metal substances denoted by the numerals 9 and 14 in FIG. 2 are not present, the heat is dissipated only through oxide parts whose thermal conductivity is low. Therefore a rise in temperature in the parts of the magnetoresistive film and the magnetic biasing metal film is very great, which causes the thermal deterioration of the magnetoresistive element. For instance, the temperature of the element is raised to about 75° C. by the electric current of $5 \times 10^5$ A/cm² and to about 150° C. by the electric current of $5 \times 10^6$ A/cm². Although this rise in temperature is varied locally according to the shape and location of the element, of course, it differs little from the aforesaid values on an average. When the ferromagnetic metal film is formed on the inner surface of the ferrite part as is the case with the present invention, on the contrary, the dissipation of heat in this part is very excellent, and thus the rise in temperature of the element is held down effectively. When the Ni-19 wt% Fe film of thickness 0.5 μm is used as the ferromagnetic metal film, for instance, the temperature of the element is about 25° C. in the case of $5 \times 10^5$ A/cm², and about 80° C. even in the case of $5 \times 10^6$ A/cm². Since the output of the magnetoresistive film lowers linearly with a rise in temperature, it increases by two to three times in the case of a high current density operation by the hold-down of the rise in temperature. The breakdown of the element, i.e. the reduction of life of the element, due to electromigration caused by applying electric current on the element is accelerated exponentially in relation to temperature by thermal activation. Therefore, the life of the element is elongated five to ten times as much by the hold-down of the rise in temperature.

The ferromagnetic metal films 9 and 14 may be formed also of a ferromagnetic amorphous alloy other than a crystalline alloy such as the Ni-Fe alloy used in the present embodiment. An amorphous metal has a higher hardness in general than a crystalline metal. Therefore the employment thereof for the head has an advantage that the wear of the head in the plane facing a magnetic recording medium is little.

When a working current density is relatively small, the formation of only either one of the ferromagnetic metal films 9 and 14 shown in FIG. 2 is sufficient for the dissipation of heat. The ferromagnetic metal films 9 and 14 show a remarkable effect of heat dissipation when their thickness is larger than about 0.1 μm. The effect of heat dissipation shown by the ferromagnetic metal films is enhanced as the thickness thereof is increased. However, the thickness is properly 2 to 3 μm at most when the rubbing of the head on a magnetic recording medium, the wear thereof, exfoliation of the thin film caused by an internal stress and further the fall of an output, which will be described later, etc. are considered.

In addition, the present invention has also such advantage that any one of systems of impressing a magnetic bias on the magnetoresistive film is applicable thereto.

The foregoing is a description on the case in which the hold-down of the rise in temperature of the element is intended. When it is intended to make an output waveform sharp so as to improve an output as well as to hold down said rise in temperature of the element, it is necessary to use a material higher in saturation flux density Bs and/or permeability μ than the high permeability magnetic ferrite for preparing the ferromagnetic metal films 9 and 14. For instance, the saturation flux density Bs permalloy is 1 T, that of an amorphous magnetic substance is 0.7 to 0.9 T, and that of sendust is 1 to 1.3 T. The saturation flux density Bs of all of these materials is 1.5 to 2.5 times larger than the value 0.5 T of the ferrite. As for the permeability in a frequency of 10 MHz, permalloy has a permeability of 2000, for instance, compared with 200 to 300 of the ferrite.

Figure 3A:
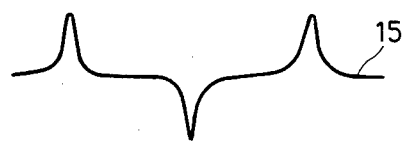
FIG. 3a is an illustration of a reproduced waveform in the conventional magnetoresistive sensor.
Figure 3B:
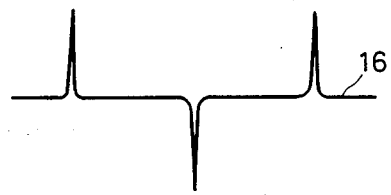
FIG. 3b is an illustration of a reproduced waveform in the magnetoresistive sensor in one embodiment of the present invention.

FIG. 3a shows a reproduced waveform 15 obtained from a conventional magnetoresistive effect head, and FIG. 3b a reproduced waveform 16 obtained from a magnetoresistive effect head which is prepared by using an Ni-19 wt% Fe alloy (permalloy) of thickness 0.5 μm for the ferromagnetic metal films 9 and 14 in the present embodiment. As is apparent from FIGS. 3a and 3b, the construction of the present invention has a very remarkably effect on the reproduced waveform of the magnetoresistive effect head.

Figure 4:
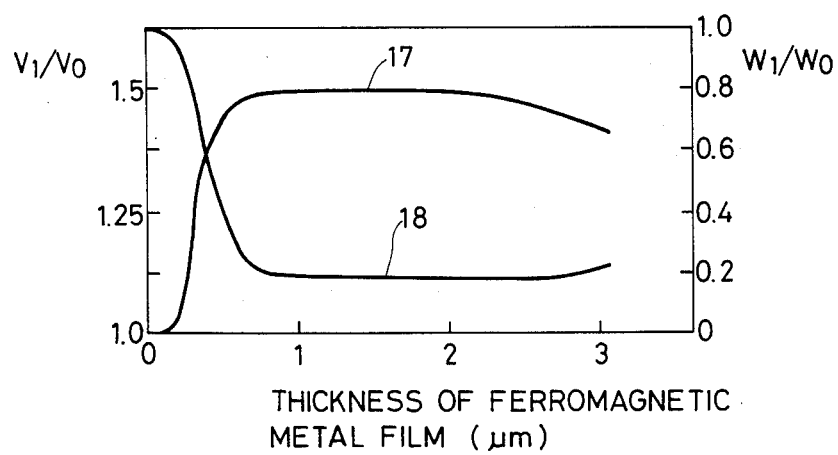
FIG. 4 is a graph showing the effect of the thickness of a ferromagnetic metal film adhering to ferrite on the output of the magnetoresistive sensor in one embodiment of the present invention and on the half-width of the reproduced waveform therein.

FIG. 4 shows the relationships between the ratio $V_1/V_0$ (curve 17) of the output $V_1$ of the magnetoresistive effect head of the present embodiment of the output $V_0$ of the conventional magnetoresistive effect head, and the ratio $W_1/W_0$ (curve 18) of the half-width $W_1$ of the reproduced waveform of the head of the present embodiment shown in FIG. 3b to the half-width $W_0$ of the reproduced waveform of the conventional head shown in FIG. 3a, on one side, and the thickness of the ferromagnetic metal films 9 and 14, on the other, in the form of curves 17 and 18 respectively. FIG. 4 quantitatively shows the effect of an improvement in the output which is produced by making the output waveform sharp in the present invention. With respect to both the output and the waveform, a remarkable effect can be perceived when the thickness of the ferromagnetic metal films 9 and 14 reaches 0.2 to 0.3 μm, and the effect becomes constant substantially when the thickness exceeds 0.8 μm. When the thickness is over 2 to 3 μm, however, the effect tends to lessen a little. Therefore, the thickness of the ferromagnetic metal film should be 0.2 to 3 μm when it is desired not only to hold down the rise in temperature of the element, but also to make the reproduced waveform sharp.

Since the present invention enables the rapid dissipation of the heat of the magnetoresistive film of the magnetoresistive sensor, as described above, it has a remarkable effect of the prevention of the deterioration of the characteristics of the element, and also an effect of improving the characteristics of the element effectively. Furthermore, since it can make a reproduced signal waveform sharp and thus improve the output, the present invention can make a high density magnetic recording head reproduce waveforms of a higher frequency than usual, producing also an effect of facilitating an electric processing of signals.

What is claimed is:

1. In a magnetoresistive sensor in which a magnetoresistive effect element having a magnetoresistive film is held between two magnetic shields formed of high permeability magnetic ferrite, with insulating layers interposed between the element and the shields, a magnetoresistive sensor characterized in that, between each of the magnetic shields formed of said high permeability magnetic ferrite and said insulating layer, a ferromagnetic metal film having a higher thermal conductivity than that of said high permeability magnetic ferrite is formed adherently to said ferrite.

2. A magnetoresistive sensor according to claim 1, characterized in that the permeability and the saturation flux density of said ferromagnetic metal film are substantially equal to or higher than those of said high permeability magnetic ferrite.

3. A magnetoresistive sensor according to claim 2, characterized in that the permeability and/or the saturation flux density of said ferromagnetic metal film are higher than those of said high permeability magnetic ferrite.

4. A magnetoresistive sensor according to claim 2, characterized in that the thickness of said ferromagnetic metal film is 0.1 to 3 $\mu$m.

5. A magnetoresistive sensor according to claim 3, characterized in that the thickness of said ferromagnetic metal film is 0.8 to 3 $\mu$m.

6. A magnetoresistive sensor according to claim 3, characterized in that the thickness of said ferromagnetic metal film is 0.2 to 3 $\mu$m.

7. A magnetoresistive sensor according to claim 1, characterized in that the thickness of said ferromagnetic metal film is 0.1 to 3 $\mu$m.

8. A magnetoresistive sensor according to claim 1, characterized in that said ferromagnetic metal film is a magnetic crystalline material.

9. A magnetoresistive sensor according to claim 1, characterized in that said ferromagnetic metal film is a magnetic amorphous material.

10. A magnetoresistive sensor according to claim 9, wherein said magnetic amorphous material is a Co-Mo-Zr amorphous alloy.

11. A magnetoresistive sensor according to claim 1, wherein said high permeability magnetic ferrite is a material selected from the group consisting of Ni-Zn ferrite and Mn-Zn ferrite.

12. A magnetoresistive sensor according to claim 1, wherein said ferromagnetic metal film is made of a material selected from the group consisting of Ni-Fe alloy, Fe-Si alloy, Co-Ni alloy and Fe-Si-Al alloy.

13. A magnetoresistive sensor according to claim 1, wherein said ferromagnetic metal film is made of Ni-19 wt% Fe alloy.

14. A magnetoresistive sensor according to claim 1, wherein said magnetoresistive film is made of Ni-19 wt% Fe alloy.

* * * * *